United States Patent [19]

Crowell

[11] Patent Number: 5,387,108
[45] Date of Patent: Feb. 7, 1995

[54] MULTI-PURPOSE, UNIVERSALLY APPLICABLE RE-RECORDABLE, AUDIBLE, MESSAGE DELIVERY SYSTEM

[76] Inventor: Christopher S. Crowell, 80 Plains Rd., Essex, Conn. 06426

[21] Appl. No.: 14,369

[22] Filed: Feb. 5, 1993

[51] Int. Cl.⁶ ................................................. G09B 5/04
[52] U.S. Cl. .................................... 434/319; 40/124.1
[58] Field of Search ............... 434/319; 40/124.1, 152, 40/152.1

[56] References Cited

U.S. PATENT DOCUMENTS

| | | | |
|---|---|---|---|
| 4,102,067 | 7/1978 | Tarrant | 40/455 |
| 4,222,188 | 9/1980 | Tarrant et al. | 40/152.1 |
| 4,791,741 | 12/1988 | Kondo | 40/124.1 |
| 5,063,698 | 11/1991 | Johnson et al. | 40/124.1 |
| 5,115,472 | 5/1992 | Park et al. | 381/152 |
| 5,182,872 | 2/1993 | Lee et al. | 40/152 |

*Primary Examiner*—Gene Mancene
*Assistant Examiner*—Jeffrey A. Smith
*Attorney, Agent, or Firm*—Melvin I. Stoltz

[57] ABSTRACT

By providing circuit means constructed for recording, retaining, and delivering an audible message upon demand and securely retaining the circuit means in a housing, a unique, multi-purpose, audible message delivery system is attained for use either independently or in cooperative relationship with a plurality of alternate products. In the preferred embodiment, the circuit means is constructed to provide ease of message re-recording upon demand. In this way, any desired message can be substituted for an existing message whenever desired. As a result, repeated use of the audible message delivery system is realized, with the system being used independently or in association with other products, such as picture frames, medicine packages, folders, notebooks, etc. In this way, specific messages can be easily transmitted between individuals in a manner previously unattainable.

12 Claims, 5 Drawing Sheets

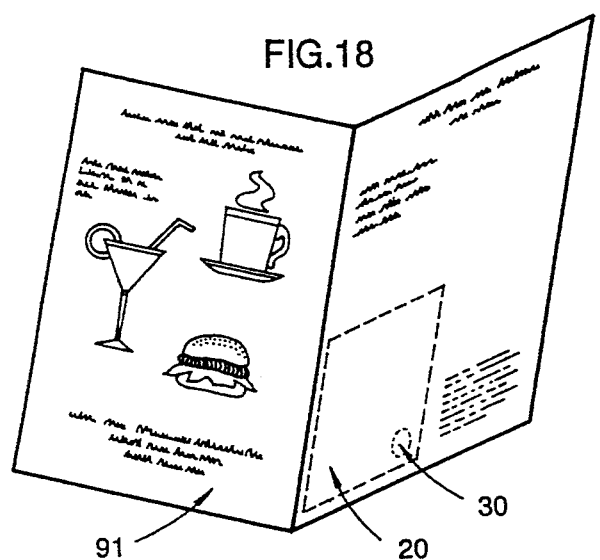
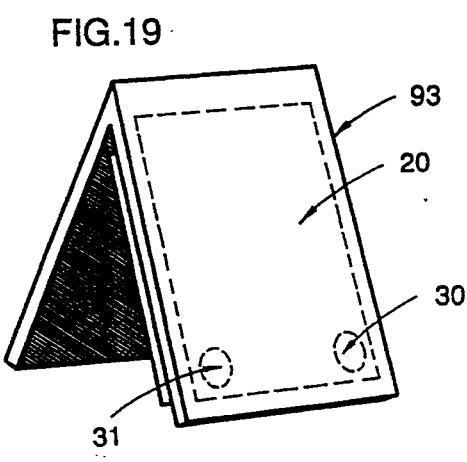
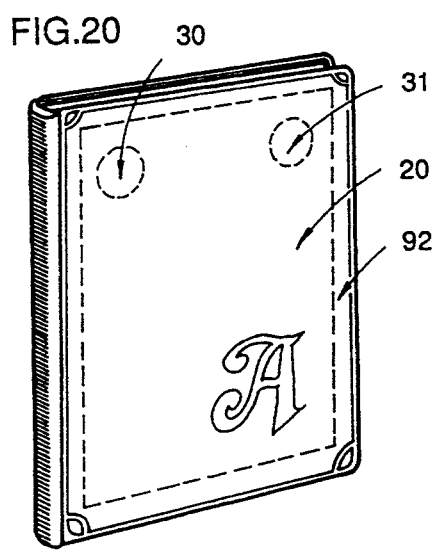
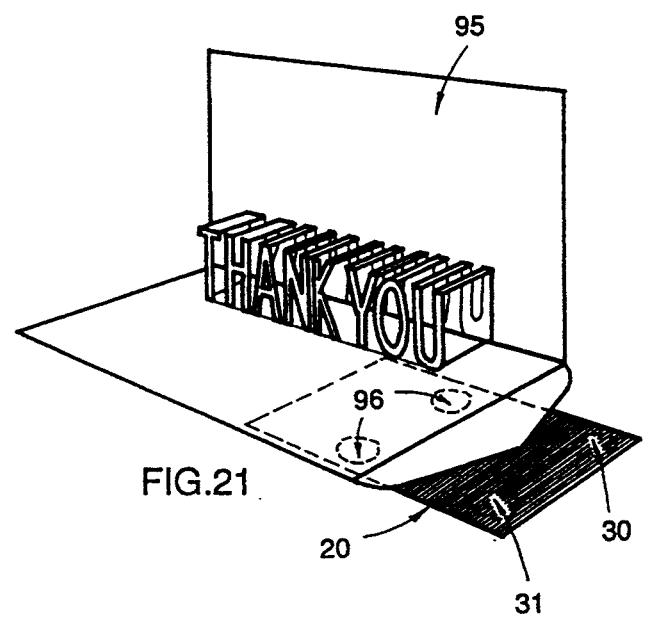
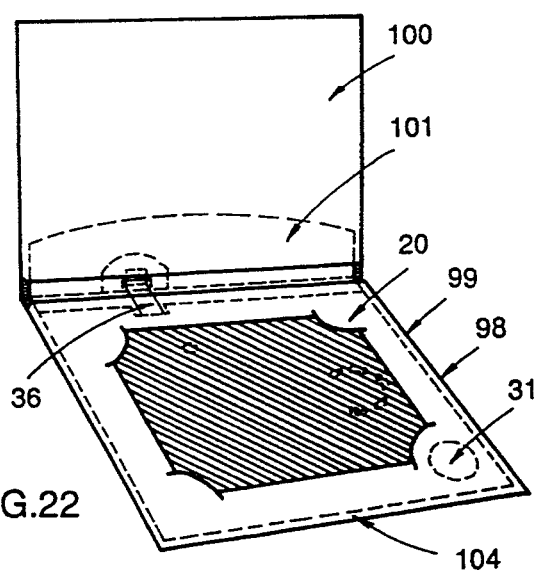

5,387,108

MULTI-PURPOSE, UNIVERSALLY APPLICABLE RE-RECORDABLE, AUDIBLE, MESSAGE DELIVERY SYSTEM

TECHNICAL FIELD

This invention relates to recorded message delivery systems and, more particularly, to a multi-purpose, multi-product, usable system incorporating recorded message delivering circuitry which enables any message to be repeatedly revised.

BACKGROUND ART

During the last several years, electronic circuits have been constructed incorporating a single, fixed audible pre-recorded message thereon, which is delivered to the user when activated. Typically, these fixed messages comprise sounds or tones which emulate a particular well-known song or provide verbal information for communicating one specific message to all users. Due to inherent limitations found in the construction of these circuits, these prior art circuits have been limited to use in greeting cards or prize/promotional gifts or games. In general, no attempt has been made to expand the use of these prerecorded message delivery circuits beyond these limited, few accepted products.

The principal drawbacks of these prior art message delivery circuits is their limited message presentation abilities and the difficulties encountered in integrating the circuit in existing products. As a result, universal applicability or acceptability of these circuits has not been realized.

One principal reason for the failure of these prior art systems to be more widely used has been the requirement that these prior art systems be fixedly mounted in the greeting card or prize package. As a result, only one-time use is attainable.

Furthermore, these prior art systems are unable to provide a wide variety of different audible messages, as well as being extremely expensive for imparting a particular message into the electronic circuit. As a result, large quantities of the same message must be usable, in order to justify the production costs.

Therefore, it is a principal object of the present invention to provide a multi-purpose, reusable, audible message delivery systems which is constructed for being universally employable either independently or in a wide variety of products and applications.

Another object of the present invention is to provide a multi-purpose, universally applicable, audible message delivery system having the characteristic features described above which enables users to receive a pre-recorded message while also being able to re-record a new message for subsequent delivery, whenever desired.

Another object of the present invention is to provide a multi-purpose, universally applicable, audible message delivery system having the characteristic features described above which is capable of being easily used by any individual for activation, to receive the recorded message, as well as easily employed for imparting a new message thereto.

Another object of the present invention is to provide a multi-purpose, universally applicable, audible message delivery system having the characteristic features described above which is capable of being manually transferred into a plurality of different products for enabling these products to provide audible messages where such messages have previously been impossible to achieve.

Another object of the present invention is to provide a multi-purpose, universally applicable, audible message delivery system having the characteristic features described above which is completely self-contained and able to be used and enjoyed as a separate, independent product.

Another object of the present invention is to provide a multi-purpose, universally applicable, audible message delivery system having the characteristic features described above which is reusable either independently or in any desired associated product.

Other and more specific objects will in part be obvious and will in part appear hereinafter.

SUMMARY OF THE INVENTION

The present invention overcomes the prior art drawbacks and establishes a completely unique product by achieving a re-recordable, multi-purpose audible message delivery system which is capable of being employed virtually universally in a wide variety of products and applications. In its principal embodiment, the present invention comprises a housing within which is contained circuitry constructed for delivering a prerecorded message when activated, while also enabling any individual to substitute a new message for the previously recorded message. By achieving this construction in a self-contained system, which is easily transportable as well as employable by any individual, attributes and broad usability, previously unattainable, are now realized.

In one principal embodiment of the present invention, a pre-recorded message delivery circuit is mounted within a housing which is constructed for either independent use or cooperative interconnected engagement with a plurality of alternate products. In this way, a message delivery system is attained which is independently usable and capable of enabling a wide variety of products to attain audible message delivery qualities heretofore unobtainable. As a result, a wide variety of alternate uses for the message delivery system is realized and the public is able to enjoy numerous products with substantially enhanced qualities and characteristics.

As fully detailed herein, the preferred audible message delivery circuit employed in this invention comprises a substantial enhancement over prior art, permanent, single message, prerecorded circuits. Although the prior art circuitry can be employed in the message delivery system of the present invention, it is preferred that the improved, audible message delivery circuit is employed.

In the preferred construction, the circuit incorporates recording means which is capable of receiving and retaining an audible message, when activated into its record mode by associated switch means. In addition, when so activated, the circuitry is constructed for receiving and retaining the audibly enunciated message, overwriting any message presently existing therein.

The circuitry also incorporates message delivery activation switch means, separate and distinct from the recording switch means, which causes the circuit to deliver the message that has been previously recorded. Whenever circuit activation switch means is employed, the circuit automatically audibly delivers the last recorded message. This message will be retained and delivered when activated, until the message is eliminated by the recording of a replacement message.

By employing this circuit construction, the multi-purpose audible message delivery system of the present invention provides enhanced use and diversity by enabling the message retained therein to be re-recorded when desired by the user. As a result, changes or updated messages can be easily attained and greater diversity and applicability of the invention is realized.

In the principal construction of the present invention, the message delivery circuit is contained within a housing, and the housing is constructed for independent use or mounted interengagement with a plurality of alternate products. One such embodiment wherein the multi-purpose, audible message delivery system of this invention is employable is with picture frames, wherein the message delivery system is mounted either in the frame itself or in the easel or stand. By employing this construction, a talking picture-bearing frame display is attained, which enables framed pictures to be given with the picture prominently displayed, while also providing a personalized message associated therewith, which is easily audibly repeated by the recipient whenever desired.

In an alternate embodiment, the audible message delivery system is self-contained with fastening means mounted on one surface thereof, allowing the system to be used independently and, if desired, positioned on a plurality of alternate surfaces. In this construction, the present invention is employable on surfaces of products such as refrigerators, cars, lunch boxes, doors, furniture, appliances, etc. In this way, any desired messages can be easily recorded on the message delivery system of this invention, with the system being placed in a convenient location for being audibly delivered to the individual for whom the message is intended.

By employing this embodiment of the present invention, the message delivery system is left for a recipient and once the system is found, the personalized message is audibly delivered by pressing the play button and listening to the message recorded for that individual. In this way, personal, daily messages can be easily left by working mothers for children coming home from school by merely recording a message and placing the message delivery system on a refrigerator, or other surface, for receipt by the child. Alternatively, a personalized message can be easily given to children on a daily basis for being heard by the child during lunch, when opening a lunch box or bag.

In an alternate embodiment, the message delivery system of the present invention may be incorporated into medicine packages, to enable a doctor or pharmacist to give specific instructions on the use and handling of the medication. In this way, patients need not be worried that the instructions might be forgotten or not completely followed, since these instructions are retained, with the drugs, and able to be replayed any time the patient desires.

As is apparent from the preceding discussions, the audible message delivery system of this invention is effectively employed in a wide variety of diverse products. In one such further alternate use, the message delivery system of the present invention is incorporated into presentation folders used by businesses, individuals, and industry. In this way, advertising information, assignments, paper work, business cards, etc. being given to another individual also incorporates a personal message for being audibly given directly to the recipient. In other alternate embodiments, the present invention is incorporated into menus, diaries, calendars, etc. for added enhancement.

As is apparent from this disclosure, a diverse variety of uses and product applications are improved and enhanced by the present invention. Although specific uses are detailed herein, these uses are presented as examples of the product types, and are not intended to limit the scope of the present invention.

The invention accordingly comprises the features of construction, combination of elements and arrangement of parts which will be exemplified in the constructions hereinafter set forth and the scope of the invention will be indicated in the claims.

THE DRAWINGS

For a fuller understanding of the nature and objects of the invention, reference should be had to the following detailed description taken in connection with the accompanying drawings in which:

FIG. 18 is a perspective view of a menu incorporating the audible message delivery system of the present invention;

FIG. 19 is a perspective view of a table tent or table information display incorporating the message delivery system of the present invention;

FIG. 20 is a perspective view of a diary or notebook incorporating the audible message delivery system of the present invention therein;

FIG. 21 is a perspective view of a pop-up greeting card incorporating the message delivery system of the present invention and depicting the message delivery system in the process of being inserted or removed therefrom; and FIG. 22 is a perspective view of a business-card holding folder incorporating the message delivery system of the present invention.

DETAILED DESCRIPTION

Figure 1:
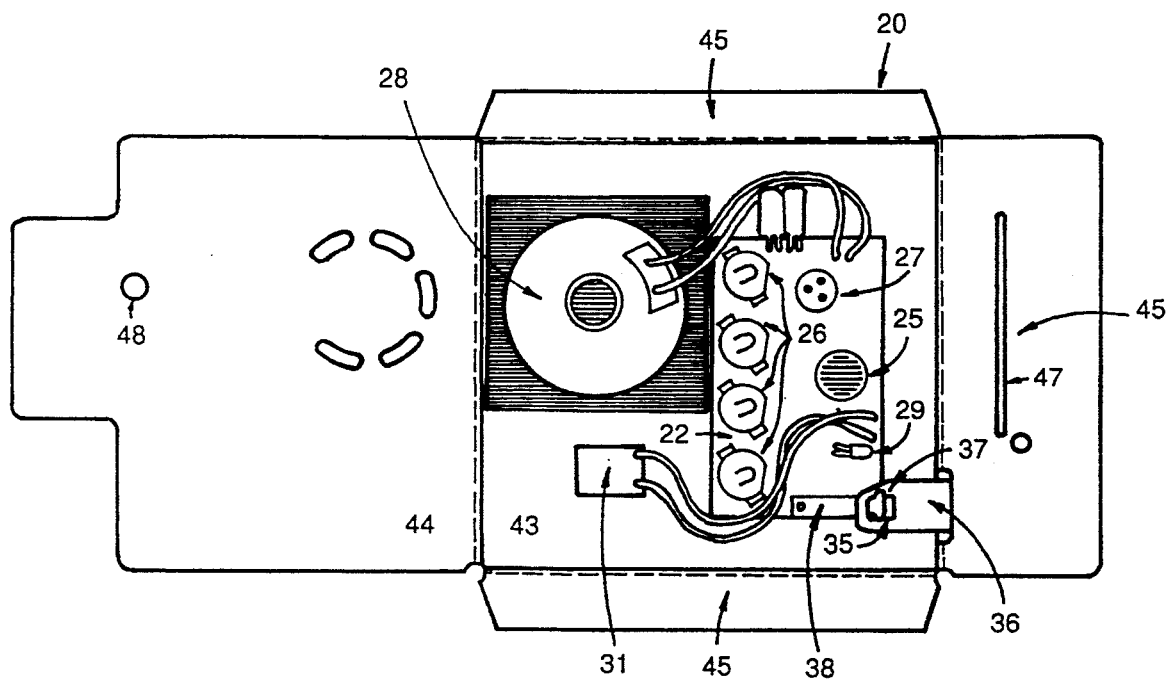
FIG. 1 is a top plan view of the audible message delivery system of the present invention with the system shown opened, displaying the message delivering circuitry contained therein.
Figure 2:
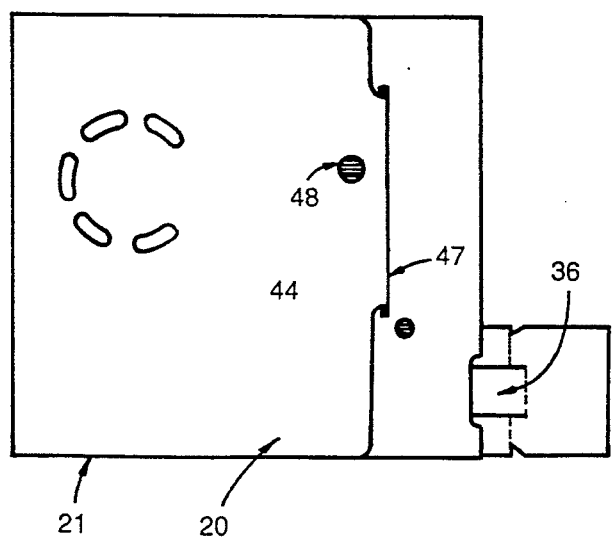
FIG. 2 is a top plan view of the assembled message delivery system of FIG. 1.

In FIGS. 1 and 2, one preferred embodiment of multipurpose universally employable, re-recordable, audible message delivery system 20 of the present invention is depicted in detail. In this embodiment, audible message delivery system 20 incorporates a housing 21, which peripherally surrounds and encloses message delivering circuitry 22. As depicted, message delivery system 20 comprises an independent, separately employable construction that can be used in a variety of alternate applications.

In the preferred embodiment, message delivery circuit 22 comprises a printed board 24 on which an integrated circuit chip 25, power means 26, and a microphone 27 are all electronically interconnected. In addition, a speaker 28 is connected to contact terminals formed on printed circuit board 24 in order to provide the desired audio output for message delivery circuit 22, when appropriately activated.

If desired, printed circuit board 24 of message delivery circuit 22 also comprises an LED 29 mounted to connection points on printed circuit board 24. LED 29 is constructed to be illuminated whenever the play mode and/or the record mode is activated.

In the preferred embodiment, power means 26 comprises a plurality of batteries which are interconnected and mounted in holders affixed to printed board 24 to provide the desired power thereto. Of course, any alternate power source can be employed, without departing from the scope of this invention.

In order to provide the desired message re-recordability in this embodiment of the present invention, message delivering circuit 24 comprises a "play" activation switch means 30 and a "record" activation switch means 31. As shown in FIG. 1, switch means 30 and 31 are connected to printed circuit board 24 at the desired contact points therefor.

Once a message has been recorded on integrated circuit chip 25 of printed circuit board 24, the recorded message is audibly delivered whenever "play" activation switch 30 is pressed. By activating switch 30, message delivery circuit 22 is activated, causing the recorded message on chip 25 to be delivered through speaker 28. This message delivery process continues each time switch 30 is activated. If desired, LED 29 can be constructed to be illuminated whenever play activation switch 30 is pressed, thereby informing the user that message delivery circuit 22 is in the activated play mode.

Whenever the user desires to record a new message, record activation switch means 31 is pressed in order to activate circuit 22 into the record mode. Once activated, the user states the desired message for receipt by microphone 27 with the message being recorded by integrated circuit chip 25, overwriting the previously recorded message. Once a new message has been received and recorded by chip 25, the new message is delivered through speaker 28 whenever desired, by activating play switch means 30. In this way, any desired message is easily recorded on message delivery circuit 22, with the recorded message being repeatedly delivered by circuit 22 each and every time play switch means 30 is activated.

Although any desired arrangement can be employed, it is preferred that the record activation switch means 31 is constructed to require continued pressure or contact during the entire record mode. In this way, complete control over the record session by the user is assured.

In the preferred embodiment, LED 29 is connected to message delivery circuit 22 for being activated each time record switch means 31 is activated. In this way, the user is notified by the illumination of LED 29 that the record mode is in progress. However, as discussed above, LED 29 can also be connected to be similarly illuminated whenever play activation switch means 30 is employed. In addition, if desired, a pause switch 32 is connected to printed circuit board 24 in order to enable individuals to pause during recording a message, without adversely affecting the timing of the message. In this way, greater flexibility and control is provided.

In order to further enhance audible message delivery system 20 of the present invention and improve its universal applicability, message delivery circuit 22 also incorporates a second or alternate play activation switch means 35. In the preferred construction, alternate switch means 35 incorporates a longitudinally movable, elongated tab 36 cooperatively associated with contacts 37 and 38.

In the preferred embodiment, tab 36 is positioned between spring biased contacts 37 and 38 in order to prevent contacts 37 and 38 from being normally electrically engaged with each other. However, when tab 36 is longitudinally moved out of interleaved relationship with contacts 37 and 38, the spring biased construction causes contacts 37 and 38 to touch each other, completing the circuit and activating message delivery circuit 22 into its play mode.

By incorporating second play activation switch means 35 in addition to play activation switch means 30, a dual play activation configuration is achieved. As detailed herein, this construction enables audible, message delivery system 20 to be universally employable.

As clearly depicted in FIGS. 1 and 2, the preferred embodiment of audible, message delivery system 20 of the present invention comprises housing 21 which peripherally surrounds and encloses message delivery circuit 22. In the preferred configuration, housing 21 incorporates body portions 43 and 44 which are constructed with a size and shape to supportingly retain and peripherally surround message delivery circuit 22. In the preferred embodiment, body portion 43 incorporates foldable edge portions 45 which peripherally surround body portion 43 and are constructed for being integrally fastened to one surface of body portion 44. In this way, message delivering circuit 22 is peripherally surrounded and securely enclosed within housing 21.

In order to enable the user to easily access power means 26, the preferred construction of housing 21 also incorporates a foldable, flap member 46 which is mounted to body portion 43 and is constructed for inserted, locked interengagement with elongated slot 47 of body portion 44. In this way, easy access to power means 26 for replacement of batteries, in the present configuration, is easily attained without otherwise affecting or disturbing message delivery circuit 22.

In order to assure ease of operation and usability of the present invention, body portion 44 of housing 21 also incorporates apertures 48 formed therein, positioned for overlying, cooperating, relationship to LED 29 and microphone 27. In this way, the illumination of LED 29 is easily seen by the user and optimum recording of the desired message by microphone 27 is enhanced.

Figure 3:
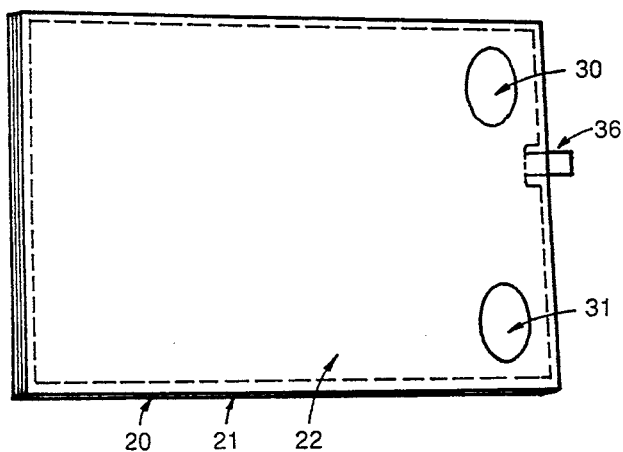
FIG. 3 is a front perspective view of one embodiment of the audible message delivery system of the present invention.
Figure 4:
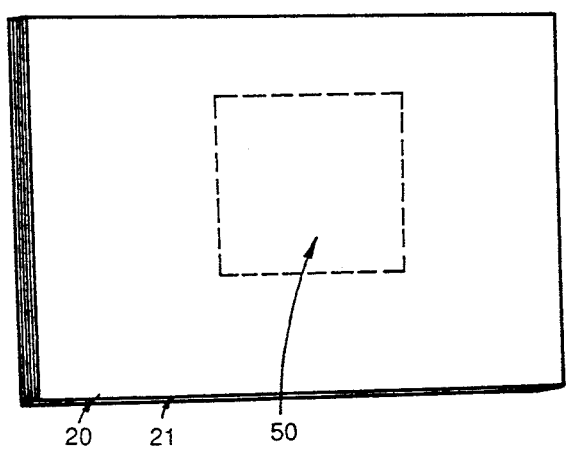
FIG. 4 is a rear perspective view of the audible message delivery system of FIG. 3.

In FIGS. 3 and 4, audible message delivery system 20 of the present invention is depicted in one of its embodiments as an independent product which can be employable in a plurality of alternate ways. In FIGS. 5 through 8, examples of such alternate uses are depicted.

In this embodiment, audible message delivery system 20 comprises housing 21 which peripherally surrounds and protects message delivery circuitry 22 contained therein. Play activation switch means 30 and record activation switch means 31 are readily accessible for use, preferably through apertures formed in housing 21 to assure ease of use. In addition, as depicted in FIG. 3, alternate play activation switch means 35 are incorporated therein with elongated tab 36 extending from housing 21 in order to activate the alternate play switch means, whenever desired.

In this embodiment, audible message delivery system 20 comprises an independent, self-contained construction for use by the consumer in a plurality of alternate locations, positions, or purposes. In the preferred embodiment, the rear surface of housing 21, depicted in FIG. 4, incorporates fastening means 50 mounted thereto, in order to provide ease of secure mounted engagement or positioning of audible message delivery system 20 on any desired surfaces.

In FIG. 4, fastening means 50 is depicted as a representative example of any one of a plurality of alternate fastening configurations or constructions that can be employed. Such constructions include adhesive means, loop type fastening means, magnetic means, clips, etc. As further detailed herein, any fastener which will assist in enabling audible message delivery system 20 of the present invention to be positioned in a desired location and securely maintained in that position is intended to be incorporated into the overall scope of protection afforded by this invention.

In operation, audible message delivery system 20 is employed by the user pressing record switch 31 to activate message delivery circuitry 22 into its record mode. Once activated, the desired message is stated and recorded by circuit 22.

When completed, audible message delivery system 20 is positioned in a location for ease of use or access by the individual to whom the message is directed. Then, once the individual receives audible message delivery system 20, that individual activates play activation switch means 30 or 36 to have the previously recorded message audibly enunciated. In this way, messages are continuously transferred between individuals or provided by one individual to another in a quick and easy fashion, with the message being easily recorded and delivered.

Figure 5:
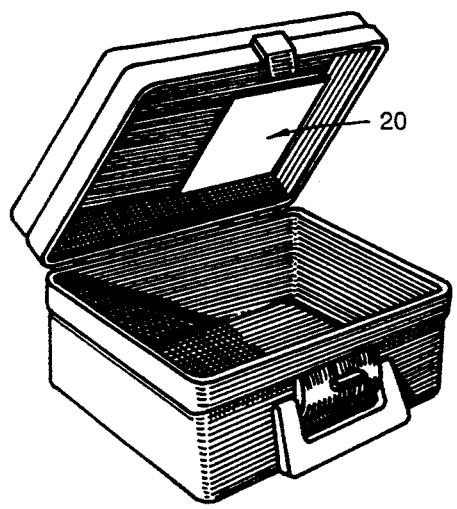
FIG. 5 is a perspective view of the audible message delivery system of FIGS. 3 and 4 mounted to a conventional lunch box.

In FIGS. 5–8, various alternate uses for audible message delivery system 20 of the present invention are depicted. In FIG. 5, the use of audible message delivery system 20 in a lunch box is shown which enables parents to daily communicate different messages to their children for receipt by the child during lunch time or any other convenient time for the child. In this way, words of encouragement, praise, or instructions about activities can be communicated to the child on a daily basis, with separate, independent, unique messages being easily provided each day. As a result, a more intimate feeling will be created between parents and children, with varying messages being provided to the child each day and being heard by the child in the voice of the parent.

Figure 6:
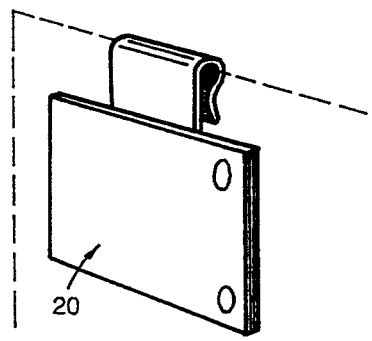
FIG. 6 is a perspective view of the audible message delivery system of FIGS. 3 and 4 and further incorporating clip means for enabling the message delivery system to be supportingly retained on any desired clip receiving edge.

In FIG. 6, an alternate embodiment for independent audible. message delivery system 20 is depicted. In this embodiment, message delivery system 20 functions to transmit office memos to various individuals. By recording a message for a fellow worker or staff employee, verbal instructions can be effectively transmitted to another individual, without fear that the verbal transmission will be misinterpreted or forgotten. In addition, audible message delivery system 20 also enables questions to be asked of one individual with that individual answering the question and returning system 20 to the individual who had the question with the answer to that question being fully and completely explained in audible message delivery system 20.

Figure 7:
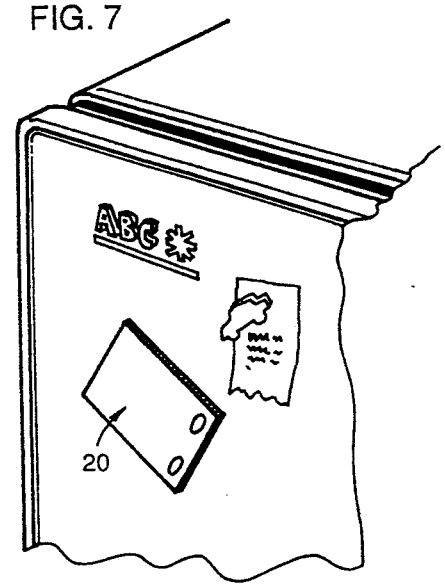
FIG. 7 is a perspective view of the audible message delivery system of FIGS. 3 and 4 mounted to a refrigerator.

In FIG. 7, an alternate embodiment of this invention is depicted with audible message delivery system 20 incorporating magnetic means for enabling system 20 to be easily mounted to appliance surfaces, such as refrigerators. In this way, messages between spouses, parents and/or children can be easily recorded and listened to by these individuals. By employing audible message delivery system of this invention, in the manner detailed above, communications between these individuals can be easily maintained and activities, schedules, and instructions can be effectively transmitted.

Figure 8:
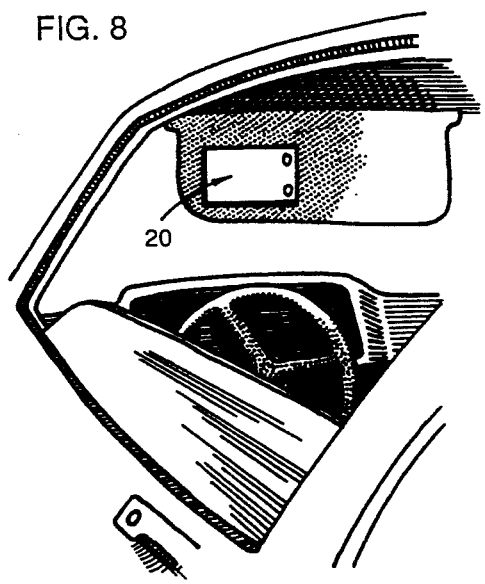
FIG. 8 is a perspective view of the audible message deliveyr system of FIGS. 3 and 4 mounted to the visor of an automobile.

In FIG. 8, a further alternate embodiment of the present invention is depicted, wherein audible message delivery system 20 incorporates fastening means which enables system 20 to be mounted on various surfaces, such as fabric bearing surfaces, as found in sun visors in automobiles. In this way, memos can be retained by an individual quickly and easily while driving or, alternatively, messages from one individual to another can be easily transmitted and placed where the driver of the automobile will find audible message delivery system 20 for receiving the desired message.

As is apparent from the foregoing detailed disclosure, audible message delivery system 20 of the present invention is capable of functioning in a plurality of alternate uses with audible message delivery system 20 functioning as a separate, independent, component, usable by individuals for a variety of purposes. In this regard, it is intended that the examples detailed above are merely representative of the numerous manners in which the present invention can be used and such examples are intended for purposes of explanation only and, not in any way, intended to limit the scope of the present invention.

In FIGS. 9-14, the audible message delivery system of the present invention is depicted incorporated within various frame or photograph containing structures. In this way, the audible message delivery system of the present invention is employed to provide an audible message to any individual viewing the particular photograph associated with the picture display structure. As a result, a dual effect is realized, with both visual and audible messages being delivered to the user.

Furthermore, in each construction, audible message delivery system 20 is preferably constructed for removability and transferability between any desired cooperating structure. As a result, optimum use of audible message delivery systems is realized with complete control over its use being enjoyed by the consumer.

Figure 9:
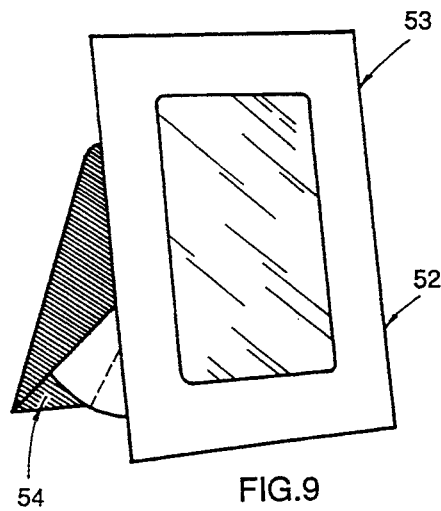
FIG. 9 is a front perspective view depicting a photograph display assembly incorporating the audible message delivery system of the present invention within the supporting stand portion of the display.
Figure 10:
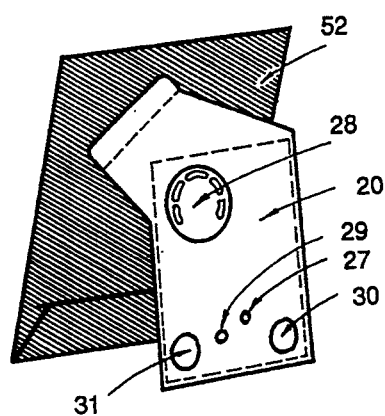
FIG. 10 is a rear perspective view of the photograph display assembly of FIG. 9 clearly depicting the secure, mounted, interengagement of the audible message delivery system within the stand portion of the photograph display assembly.
Figure 11:
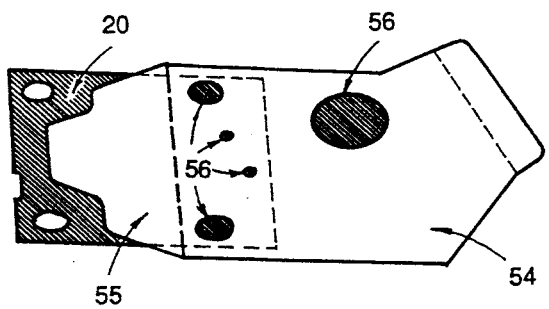
FIG. 11 is a plan view of the stand portion of the photograph display assembly of FIGS. 9 and 10 depicting the removal/insertion of the audible message delivery system of the present invention in the retaining zone of the stand portion thereof.

In FIGS. 9 through 11, one embodiment of a picture frame display incorporating audible message delivery system 20 of the present invention is shown. In this embodiment, frame assembly 52 comprises a picture bearing portion 53 and a supporting stand or easel 54.

Picture portion 53 of frame assembly 52 comprises a generally conventional construction with a cut-out portion formed therein for enabling any desired picture or photograph to be positioned in cooperating association therewith for viewing by the user. Means to securely retain the picture in the desired position are provided.

In addition to the generally conventional construction of picture portion 53, frame assembly 52 also incorporates a unique stand portion 54 which is constructed, as shown in FIGS. 10 and 11, for removably receiving and securely retaining audible message delivery system 20. Although various alternate configurations can be employed, this embodiment is constructed with stand 54 incorporating an interior receiving zone within which audible message delivery system 20 is removably placed and securely retained, whenever desired.

As shown in FIG. 11, stand 54 incorporates an internal pocket formed therein for slidably receiving audible message delivery system 20 whenever desired. System 20 is securely retained therein by employing flap 55 of stand 54, which folds for securely holding audible message delivery system 20 within stand 54, with flap 55 being retained in the desired position by cooperating slot means formed in stand 54. In this way, audible message delivery system 20 is securely retained within stand 54, ready to record and/or deliver the recorded message whenever desired, while also being easily removed, when desired, for use in another product or surface.

In the preferred embodiment, stand 54 incorporates apertures 56 formed in stand 54 and positioned for aligned, cooperating relationship with various components of audible message delivery system 20. In the preferred construction, apertures 56 are employed and positioned for overlying relationship with speaker 28, microphone 27, LED 29, play activation switch means 30, and record activation switch means 31. In this way, all of the principal components with which the user must interact are readily visible to the user, thereby assuring ease of operation and enjoyment by the user.

By employing this embodiment of the present invention, individuals are able to personalize photographs which may be given as gifts to other individuals. By employing flame assembly 52, an individual is now able to give an attractive flames picture as a gift, while also incorporating therewith a verbal message which can be played by the recipient any time the recipient so desires.

As detailed above, the girl giver merely presses record button 31 to activate audible message delivery system 20 into its record mode and records a desired message for the recipient. Then, once the girl has been received, the recipient merely presses play activation switch means 30 in order to have the audible message delivered, any time desired, while also enjoying the picture displayed therewith.

Figure 12:
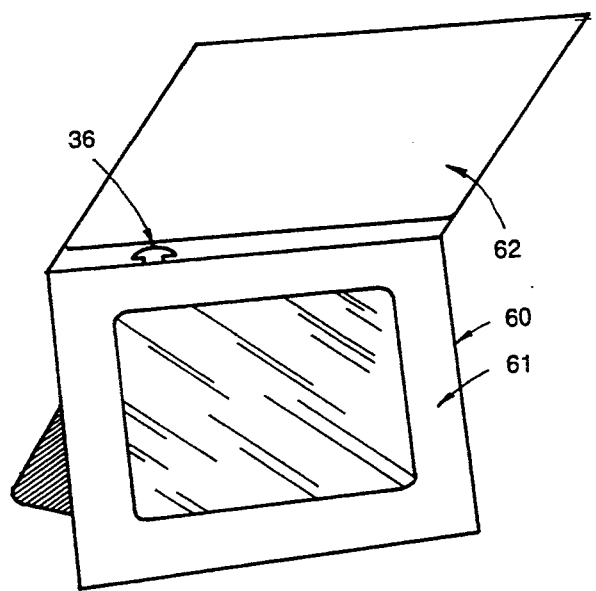
FIG. 12 is a front elevational perspective view of an alternate embodiment of a photograph display assembly incorporating the audible message delivery system of the present invention therein.
Figure 13:
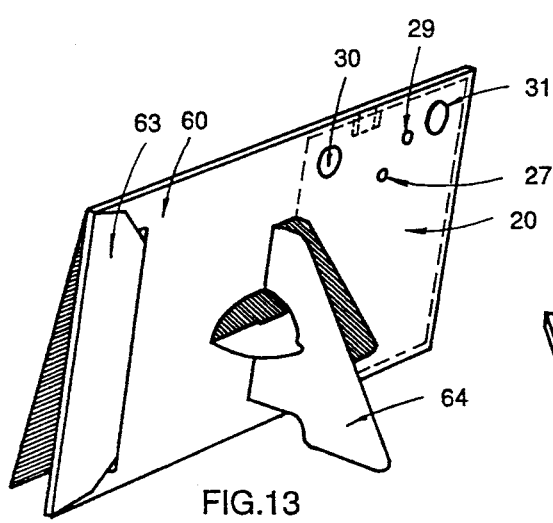
FIG. 13 is a rear perspective view of the photograph display assembly of FIG. 12 detailing the secure mounted positioning of the audible message delivery system of the present invention therein.

In FIGS. 12 and 13, an alternately constructed, photo display assembly 60 is depicted, incorporating audible message delivery system 20 of the present invention. In this embodiment, display assembly 60 comprises a picture bearing portion 61 and a movable flap 62, which is movable between a picture covering position and a picture viewing position.

As shown in FIG. 13, the desired photograph or picture is easily inserted into an internal retaining zone formed in picture bearing portion 61 by employing movable flap portion 63, which forms a part of picture portion 62. Flap 63 is securely retained in slot 65 to assure the desired secure retention of the photo therein.

In addition, audible message delivery circuit 20 is also securely mounted within the internal retaining zone of picture bearing portion 61 for removable, secure, retained engagement therein. In this way, the desired audible message can be recorded and played by the recipient whenever desired.

In the preferred embodiment, apertures are formed in one surface of picture bearing portion 61 in order to enable microphone 27 and LED 29 to be used in their optimum manner, as well as enabling play activation switch means 30 and record activation switch means 31 to be easily accessed. If desired, a portable stand portion 64 may also be formed in one surface of picture bearing portion 61 in order to enable the picture retained therein to be permanently displayed, if so desired.

In this embodiment, tab 36 of audible message delivery system 20 is preferably employed, with its terminating end securely affixed to movable flap 62. By employing this construction, the message recorded on message delivering circuit 22 of system 20 is automatically activated into the play mode each and every time movable flap 62 is moved from the picture covering position to the picture revealing position. As a result, whenever an individual opens photo display assembly 60 to reveal the picture retained therein, the message recorded on audible message delivery system 20 is automatically activated into the play mode, delivering the recorded message.

If permanent display of the photograph retained within picture bearing portion 61 is desired, tab 36 can be severed along with flap 62. In this way, picture bearing portion 61 would be continuously opened for constant display with the audible message delivery system 20 being easily activated by pressing play activation switch 30 thereof.

Figure 14:
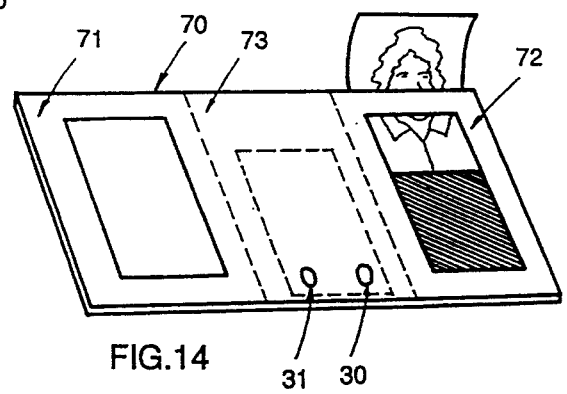
FIG. 14 is a front perspective view of a further photograph display assembly incorporating the audible message delivery system of the present invention therein.

In FIG. 14, a further alternate embodiment of a picture display system is depicted. In this embodiment, multi-photo display assembly 70 is shown incorporating two foldable sections or panels 71 and 72, each of which are constructed for securely retaining and displaying a photograph therein. In this embodiment, a third section 73 is also incorporated with audible message delivery system 20 of the present invention securely retained therein. Preferably, apertures are formed in section 73 in order to enable easy access to at least play activation switch means 30 and record activation switch means 31.

By employing multi-photo display assembly 70, a plurality of photographs can be simultaneously displayed as well as messages delivered, whenever desired by activating audible message delivery system 20. In addition, this construction can be employed for transmitting photographs to other individuals, such as distant relatives or pen pals, whereby photographs can be transmitted easily to such individuals along with a personal, audible message. If desired, multi-photo display assembly 70 can be constructed with panels 71 or 72 being removable from assembly 70 to enable the pictures to be retained in the framed mode. However, even if both panels 71 and 72 have been removed, audible message delivery system 20 is still usable, either in association with other products, or independently such as by being returned with a personal message incorporated thereon.

Figure 15:
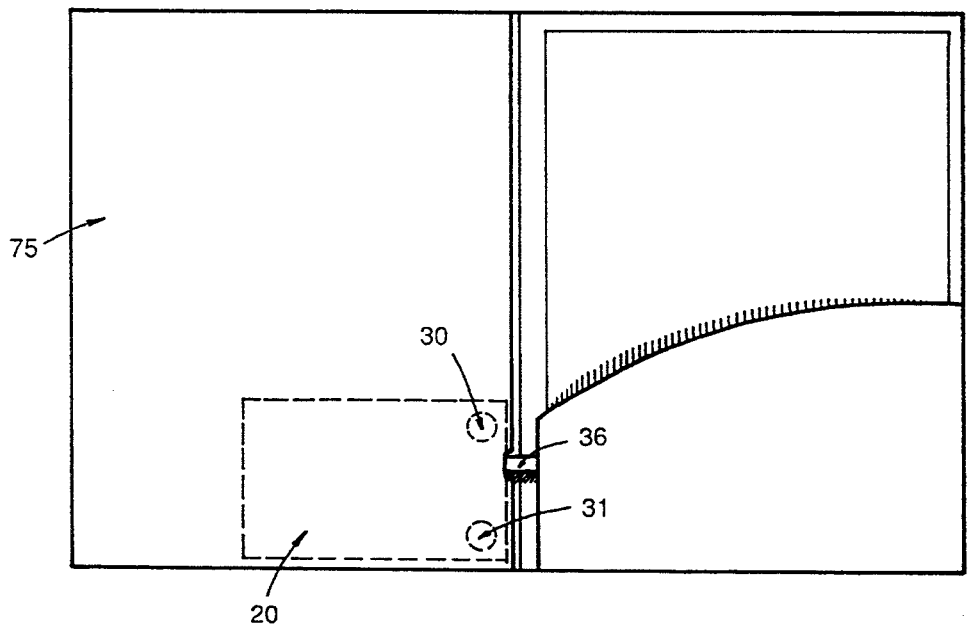
FIG. 15 is a top plan view depicting the audible message delivery system of the present invention in association with paper holding folders.

In FIG. 15, a still further embodiment of the present invention is depicted, wherein audible message delivery system 20 of the present invention is removably incorporated in a presentation or document-retaining folder for use by individuals in presenting papers, advertising, assignments, business cards and the like to other individuals. Presentation folder 75 incorporates a generally conventional construction similar to folders presently being marketed, and can be formed in any desired size or shape. In accordance with this invention, folder 75 incorporates a receiving zone contained therein within which audible message delivery system 20 of the present invention is removably retained.

As depicted in FIG. 15, play activation tab 36 is incorporated into audible message delivery system 20 and preferably affixed to one panel of folder 75 in order to automatically activate message delivery system 20 whenever folder 75 is opened. However, if desired, apertures can be formed in folder 75 in overlying alignment with play activation switch means 30 and record activation switch means 31 in order to assure easy accecss to the switch means by the user.

By employing presentation folder 75 of the present invention, any individual having to give any type of paper work to another can employ presentation folder 75 in order to simultaneously provide the recipient with a verbal communication along with the printed or written material. By employing this invention, businessmen can personalize advertising literature being given to customers or attorneys can highlight portions of a contract which should be reviewed by a client.

In general, any individual communicating or delivering printed or written material to another can employ presentation folder 75 effectively to audibly highlight and emphasize the importance or pertinent aspects of the material which should be reviewed. In this way, a generally conventional presentation folder is substantially enhanced by incorporating therewith the audible message delivery system of the present invention.

Figure 16:
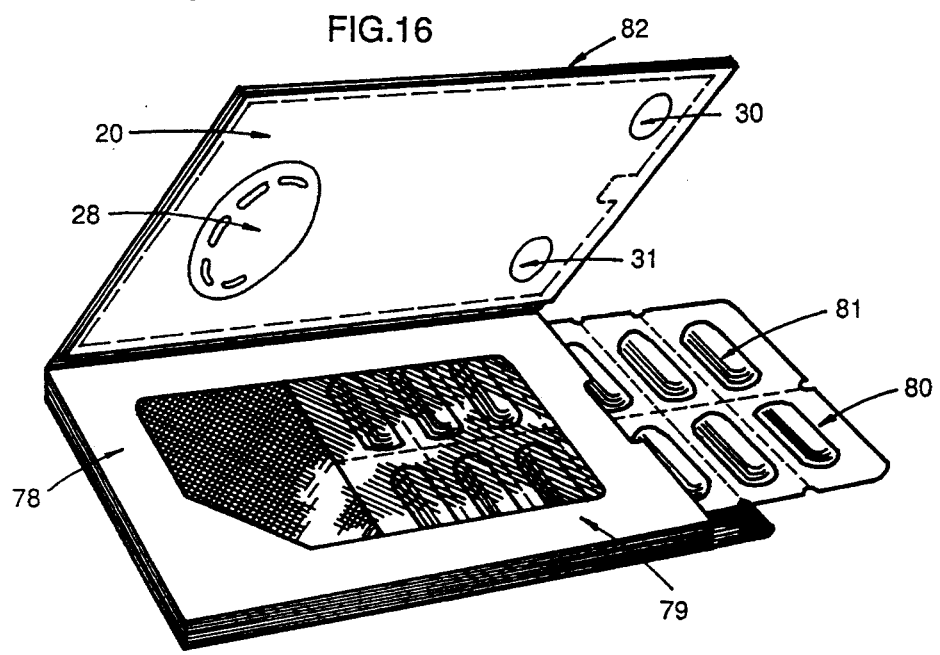
FIG. 16 is a perspective view depicting the audible message delivery system of the present invention associated with a medicine containing package.

In FIG. 16, a still further alternate embodiment of the present invention is depicted which can be of particular importance and benefit to many individuals. As depicted therein, audible message delivery system 20 is incorporated into medication bearing package 78 to provide the user with both the desired medication and an audibly repeatable message for instructing the individual on the proper usage of the medication.

As depicted in this embodiment, medication bearing package 78 incorporates a container portion 79 which securely holds and retains holder 80 within which medication 81 is sealingly mounted. In addition, medication package 78 also incorporates a cooperating removable panel portion 82, within which audible message delivery system 20 of the present invention is securely retained.

In the preferred embodiment, panel portion 82 is constructed for receiving and securely retaining audible message delivery system 20 therein, while also incorporating apertures to assure ease of access of play activation switch means 30 and record activation switch means 31. In addition, if desired, an additional aperture can be formed in panel 82 to assure that speaker 28 will be easily heard by the user.

In employing medication package 78 of the present invention, either a doctor, pharmacist, or manufacturer records specific use instructions on audible message delivery system 20 to assure that the recipient will have the specific instructions whenever desired. As a result, specific, precise instructions are provided to individuals having a need for verbal repetitive reinforcement. By merely pressing play activation switch means 30, whenever desired, these individuals are able to repeatedly receive the specific use instructions, therefor assuring that the medication is being properly administered.

By employing this embodiment of the present invention, substantially enhanced benefits to individuals are realized, since medication compliance is more easily attained. With the present invention, individuals can repeatedly be audibly reinforced on the specific use of the medication by merely activating the play activation switch means 30 to receive these instructions. If desired, added words of encouragement to assure compliance can also be incorporated into the desired message to further improve patient compliance.

Figure 17:
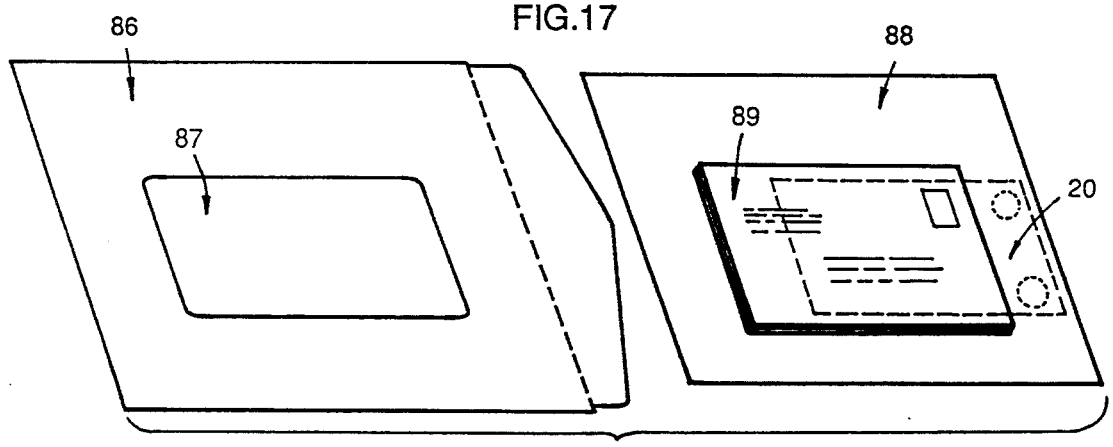
FIG. 17 is a perspective view of a multi-purpose, multi-use mailing system incorporating the audible message delivery system of the present invention.

In FIG. 17, a still further alternate embodiment of the present invention is depicted wherein audible message delivery system 20 of the present invention is inserted into a continuous mailing system 85. As depicted therein, mailing system 85 incorporates a reusable envelope 86 which preferably incorporates reusable fastening means on the flap portion thereof to enable envelope 86 to be repeatedly used. In addition, an address cut-out or window zone 87 is preferably formed in envelope 86 for enabling any desired address to be visibly positioned in relationship thereto so that envelope 86 can be reused.

In the preferred embodiment, support panel 88 incorporates audible message delivery system 20 along with stack 89 of blank labels on which an addressee and stamps are to be placed. Once used, the top label is removed, allowing the next label to be used. Furthermore, panel 88 is constructed for being inserted in envelope 86 and positioning stack 89 is visible in cooperating relationship with window zone 87.

In using mailing system 85, any desired message can be transmitted by using message delivery system 20, as detailed above. In addition, any desired material can be incorporated into the envelope, thereby transmitting to the recipient both a written message as well as an audibly delivered verbal message.

In FIGS. 18 through 21, still further alternate embodiments of the present invention are depicted. These embodiments are incorporated herein to further emphasize the universal applicability of the present invention and the scope of products within which audible message delivery system 20 of the present invention can be employed.

In FIG. 18, audible message delivery system 20 is shown incorporated into an otherwise conventional menu 91 for enabling the restaurant to provide personal messages to the patrons of the restaurant. In this way, specials of the day can be verbally enunciated to the patron, who would only need to press play activation switch means 30 to have daily specials audibly enunciated. Alternatively, words of thanks for patronizing the restaurant can be recorded onto audible message delivery system 20 for personally thanking the patron for dining in the restaurant.

In FIG. 19, a product similar to menu 91 is depicted. In this embodiment, message delivery system 20 of the present invention is incorporated into a table tent or table information display 93 for use by restaurants or other businesses wherein daily messages or words of welcome are desirable to communicate to patrons. Preferably, audible message delivery system 20 is incorporated into one panel of table tent 93, with play activation switch means 30 and record activation switch means 31 readily accessible for use. In this way, any desired message can be recorded onto audible message delivery system 20 and played back by the consumer while sitting at the table, to either hear daily specials or the particular message recorded thereon by the owner.

In FIG. 20, audible message delivery system 20 is depicted incorporated within a diary, notebook, journal, signature book, etc. for enabling individuals to also enjoy recording and playback of messages from different individuals. As shown in FIG. 20, book 92 incorporates audible message delivery system 20 in one panel thereof, with play activation switch means 30 and record activation switch means 31 positioned in relationship with the cover for easy access and use by an individual wishing to play a prerecorded message or record a new message onto system 20.

In FIG. 21, a further embodiment of the present invention is depicted wherein audible message delivery system 20 of the present invention is shown in the process of being removably inserted into a pop-up card 95. Pop-up card 95 may incorporate any desired message or pictorial display for emphasizing a theme or business. In addition, by incorporating audible message delivery system 20 into card 95, with play activation switch means 30 and record activation switch means 31 being easily accessed through apertures 96 formed in card 95, individuals can also transmit to a recipient both a verbal and written message. In this way, thank you notes can be verbally personalized along with the written message. In addition, businessmen can transmit both written and verbal communications to customers or clients.

In FIG. 22, a further business-oriented system is disclosed wherein an alternate embodiment of audible message delivery system 20 is removably retained in card holding folder 98. In this embodiment, folder 98 comprises a base portion 99 and a movable cover portion 100 pivotally interconnected to base portion 99 and positioned in overlying relationship therewith. In addition, base portion 99 incorporates a holding and display zone 102 within which a business card or message card is retained. By employing this construction, individuals can audibly communicate personal messages to clients or customers in a highly effective and efficient manner, while also presenting business cards or notes to the customer along with the personal message.

In this embodiment, audible message delivery system 20 also incorporates a pivotable flange portion 101 affixed to the housing 21 thereof. In addition, play activation tab 36 is permanently connected to pivotable flange 101. By employing this embodiment, audible message delivery system 20 is easily inserted and removed from holder 98 for ease of use and activation by the recipient.

Instead of being required to directly connect tab 36 to cover portion 100, the user merely inserts housing 21 of audible message delivery system 20 into card holding portion 99 while also inserting movable flange portion 101 into cover 100. In this way, whenever the client or customer opens or pivotally moves cover portion 100 away from base portion 99 of card holder 98, the message retained on audible message delivery system 20 is automatically delivered. If desired, holding portion 99 may be constructed with edge 104 thereof cooperating with an outer surface mounted flap, as detailed above, in order to enable message delivery system 20, with housing 21 and flange 101 to be easily inserted through edge 104 and positioned as desired for operation.

Preferably, record activation switch means 31 is positioned in one corner of base portion 99 without a cutout zone cooperatingly associated therewith. In this way, only the individual recording the message is aware of the existence of audible message delivery system 20 and the positioning of record button 31. However, if desired, cutout zones could be formed in base portion 99, in a manner detailed above.

As is evident from the preceding disclosure, a plurality of alternate uses can be employed for the audible message delivery system of this invention. Although various alternate constructions have been fully depicted and disclosed herein, it is understood that these various embodiments are merely representative of the numerous alternate products and constructions within which the present invention can be employed. In addition, although not emphasized, it is apparent that particular groups of individuals such as the blind, the elderly, young children, the reading impaired, etc., are substantially benefitted from this invention and would enable numerous, specially designed products to be developed for each group. Consequently, although each of these embodiments is considered to be encompassed within the scope of the present invention, it is intended that these embodiments should not be considered in a limiting manner and merely are included as representative samples of the products within which the present invention can be employed.

In addition, although the preferred embodiment detailed above employs audible message delivery system 20 with housing 21 incorporated within these products, in order to assure secure, removable, retained engagement of system 20 in the various products, it is possible that housing 21 of audible message delivery system 20 can be eliminated and message delivery circuitry 22 permanently incorporated into any particular product, if so desired. As a result, any products incorporating message delivery circuit 22 therein is intended to be included within the scope of the present invention.

It will thus be seen that the objects set forth above, among those made apparent from the preceding description are efficiently attained and, since certain changes may be made in the above articles without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Having described my invention, what I claim as new and desire to secure by Letters Patent is:

1. A multi-purpose, re-recordable, audible message delivery system for enabling individuals to specialize or personalize a message for delivery to another, said system comprising
    A. circuit means
        a. constructed for repeatedly recording and retaining an audio signal and delivering said recorded signal,
        b. responsive to a play activation signal for activating said circuit means to deliver a previously recorded audio signal,
        c. responsive to a record activation signal for enabling said circuit means to receive and record an audible message,
        d. comprising a speaker electronically connected to the circuit for delivering the audible message,
        e. a microphone mounted to the circuit means in interconnected, cooperating relationship with the message recording circuit thereof for receiving the audible message and delivering the audible message to the recording means, and
        f. an LED mounted to said circuit means and constructed for being activated in response to the activation of at least one switch means, thereby enabling the user to immediately know when said switch means has been moved from its normally off position to its on position;
    B. first switch means
        a. movable between an off position and an on position, and
        b. connected to said circuit means for transmitting thereto said play activation signal whenever said switch means is in its on position;
    C. second switch means
        a. movable between an off position and an on position, and
        b. connected to the circuit means for transmitting thereto said record activation signal whenever the second switch means is in its on position; and
    D. a housing constructed for
        a. supportingly retaining and protecting the circuit means,
        b. providing easy access to said first and second switch means, and
        c. being movably positionable in a plurality of alternate positions and locations,
whereby a multi-purpose, re-recordable audible message delivery system is attained which is capable of being easily employed by any individual for recording any desired audible message as well as delivering the audible message upon demand whenever desired.

2. The multi-purpose, re-recordable, audible message delivery system defined in claim 1, wherein said housing is further defined as peripherally surrounding and fully enveloping said circuit means, forming a completely self-contained message delivery system capable of being employed either independently or in association with a plurality of alternate products.

3. The multi-purpose, re-recordable, audible message delivery system defined in claim 2, wherein said housing is further defined as comprising fastening means formed on one surface thereof for enabling said audible message delivery system to be securely affixed to any desired surface, thereby effectively delivering the previously recorded message to another individual at any desired location.

4. The multi-purpose, re-recordable, audible message delivery system defined in claim 3, wherein said fastening means is further defined as enabling said multi-purpose, re-recordable, audible message delivery system to be securely affixed to a surface of at least one selected from the group consisting of appliances, furniture, lunch boxes, fabric bearing members, and metallic products.

5. The multi-purpose, re-recordable, audible message delivery system defined in claim 3, wherein said system is further defined as being removably mountable in receiving pockets formed in a plurality of alternate, cooperating products for enabling said products to possess re-recordable message delivering capabilities.

6. The multi-purpose, re-recordable, audible message delivery system defined in claim 5, wherein said alternate products comprise at least one selected from the group consisting picture frames, photo-display envelopes, medication-bearing packages, document holding folders, menus, table stands, mailing packages, books, diaries, journals, and business card holders.

7. The multi-purpose, re-recordable, audible message delivery system defined in claim 1, wherein said housing is further defined as comprising a pivotable, longitudinally extending flange portion cooperatingly associated with the first switch means for automatically transmitting the play activation signal whenever the panel portion is moved from a first housing overlying position to a second outwardly pivoted position.

8. The multi-purpose, re-recordable, audible message delivery system defined in claim 1, wherein said first and second switch means are further defined as comprising push-button type switch means constructed for being maintained in the off position and activated into the on position by compressing a portion thereof to bring the contacts formed therein into engagement with each other.

9. A multi-purpose, re-recordable, audible message delivery system for enabling individuals to specialize or personalize a message for delivery to another, said system comprising
    A. circuit means
        a. constructed for repeatedly recording and retaining an audio signal and delivering said recorded signal,
        b. responsive to a play activation signal for activating said circuit means to deliver a previously recorded audio signal, and
        c. responsive to a record activation signal for enabling said circuit means to receive and record an audible message;
        d. comprising a power source;
    B. first switch means
        a. movable between an off position and an on position, and
        b. connected to said circuit means for transmitting thereto said play activation signal whenever said switch means is in its on position;
    C. second switch means a. movable between an off position and an on position, and
   b. connected to the circuit means for transmitting thereto said record activation signal whenever the second switch means is in its on position; and
D. a housing
   a. supportingly retaining and protecting the circuit means,
   b. providing easy access to said first and second switch means,
   c. being movably positionable in a plurality of alternate positions and locations,
   d. peripherally surrounding and fully enveloping said circuit means, forming a completely self-contained message delivery system capable of being employed either independently or in association with a plurality of alternate products, and
   e. comprising a pivotable panel portion
      1. positioned in aligned, overlying, covering relationship with the power source for providing access for repair or replacement thereof, and
      2. movable between a first, housing closing position and a second, housing open position,
whereby a multi-purpose, re-recordable audible message delivery system is attained which is capable of being easily employed by any individual for recording any desired audible message as well as delivering the audible message upon demand whenever desired.

10. A multi-purpose, re-recordable, audible message delivery system for enabling individuals to specialize or personalize a message for delivery to another, said system comprises
   A. circuit means
      a. constructed for repeatedly recording and retaining an audio signal and delivering said recorded signal,
      b. responsive to a play activation signal for activating said circuit means to deliver a previously recorded audio signal, and
      c. responsive to a record activation signal for enabling said circuit means to receive and record an audible message;
   B. first switch means
      a. movable between an off position and an on position, and
      b. connected to said circuit means for transmitting thereto said play activation signal whenever said switch means is in its on position;
   C. second switch means
      a. movable between an off position and an on position, and
      b. connected to the circuit means for transmitting thereto said record activation signal whenever the second switch means is in its on position;
   D. a housing constructed for
      a. supportingly retaining and protecting the circuit means,
      b. providing easy access to said first and second switch means, and
      c. being movably positionable in a plurality of alternate positions and locations; and
   E. a product comprising a medication container incorporating
      a. a first portion comprising a holding zone wherein said medication is securely retained, and
      b. a second portion comprising a cooperating cover portion having a cavity formed therein for securely retaining the housing of the audible message delivery system, enabling said housing to be easily positioned and securely retained therein for cooperating, associated use with said medication container;
whereby a re-recordable audible message delivery system is attained which is capable of being easily employed by any individual for enabling messages to be recorded and delivered to a consumer.

11. A multi-purpose, re-recordable, audible message delivery system for enabling individuals to specialize or personalize a message for delivery to another, said system comprising
   A. circuit means
      a. constructed for repeatedly recording and retaining an audio signal and delivering said recorded signal,
      b. responsive to a play activation signal for activating said circuit means to deliver a previously recorded audio signal, and
      c. responsive to a record activation signal for enabling said circuit means to receive and record an audible message;
   B. first switch means
      a. movable between an off position and an on position, and
      b. connected to said circuit means for transmitting thereto said play activation signal whenever said switch means is in its on position;
   C. second switch means
      movable between an off position and an on position, and
      connected to the circuit means for transmitting thereto said record activation signal whenever the second switch means is in its on position;
   D. a housing constructed for
      a. supportingly retaining and protecting the circuit means,
      b. providing easy access to said first and second switch means, and
      c. being movably positionable in a plurality of alternate positions and locations; and
   E. a product comprising a photograph display construction incorporating
      a. a first portion comprising a picture retaining frame, and
      b. a second portion comprising a first portion supporting and holding stand, said stand incorporating
         1. a cavity formed therein for receiving and retaining the housing of said audible message delivery system and
         2. a pivotable flap portion formed therewith for enabling said housing of the audible message delivery system to be removably inserted into the retaining cavity, enabling said housing to be removed and replaced whenever desired in an easy and convenient manner.

12. The multi-purpose, re-recordable, audible message delivery system defined in claim 11, wherein said stand is further defined as comprising apertures zones formed therein and positioned for cooperating, overlying aligned interengagement with the switch means for enabling easy activation and use of said first and second switch means.

* * * * *

US005387108C1

(12) EX PARTE REEXAMINATION CERTIFICATE (5613th)
United States Patent
Crowell

(10) Number: US 5,387,108 C1
(45) Certificate Issued: Nov. 28, 2006

(54) MULTI-PURPOSE, UNIVERSALLY APPLICABLE RE-RECORDABLE, AUDIBLE, MESSAGE DELIVERY SYSTEM

(76) Inventor: Christopher S. Crowell, 80 Plains Rd., Essex, CT (US) 06426

Reexamination Request:
No. 90/006,645, May 22, 2003

Reexamination Certificate for:
Patent No.: 5,387,108
Issued: Feb. 7, 1995
Appl. No.: 08/014,369
Filed: Feb. 5, 1993

(51) Int. Cl.
*G09B 5/04* (2006.01)
*G09F 1/00* (2006.01)

(52) U.S. Cl. .................. 434/319; 40/124.01; 40/124.03
(58) Field of Classification Search .................. 434/118, 434/318, 319, 169
See application file for complete search history.

(56) References Cited

U.S. PATENT DOCUMENTS

| | | | | |
|---|---|---|---|---|
| 3,691,312 A | * | 9/1972 | Peterson | 360/2 |
| 4,001,893 A | * | 1/1977 | Yamamoto | 360/137 |
| 4,167,787 A | * | 9/1979 | Satoh et al. | 360/137 |
| 4,367,843 A | * | 1/1983 | Bros et al. | 231/7 |
| 4,654,728 A | * | 3/1987 | Lunsford | 360/74.1 |
| 4,791,741 A | * | 12/1988 | Kondo | 704/272 |
| 4,814,905 A | * | 3/1989 | Hashimoto | 360/74.1 |
| 4,820,233 A | * | 4/1989 | Weiner | 446/303 |
| 4,934,079 A | * | 6/1990 | Hoshi | 40/427 |
| 5,208,717 A | * | 5/1993 | Takao | 360/137 |
| 5,209,665 A | * | 5/1993 | Billings et al. | 434/169 |
| 5,359,698 A | * | 10/1994 | Goldberg et al. | 704/201 |

FOREIGN PATENT DOCUMENTS

GB 1364904 * 11/1971

* cited by examiner

*Primary Examiner*—Kathleen Mosser

(57) ABSTRACT

By providing circuit means constructed for recording, retaining, and delivering an audible message upon demand and securely retaining the circuit means in a housing, a unique, multi-purpose, audible message delivery system is attained for use either independently or in cooperative relationship with a plurality of alternate products. In the preferred embodiment, the circuit means is constructed to provide ease of message re-recording upon demand. In this way, any desired message can be substituted for an existing message whenever desired. As a result, repeated use of the audible message delivery system is realized, with the system being used independently or in association with other products, such as picture frames, medicine packages, folders, notebooks, etc. In this way, specific messages can be easily transmitted between individuals in a manner previously unattainable.

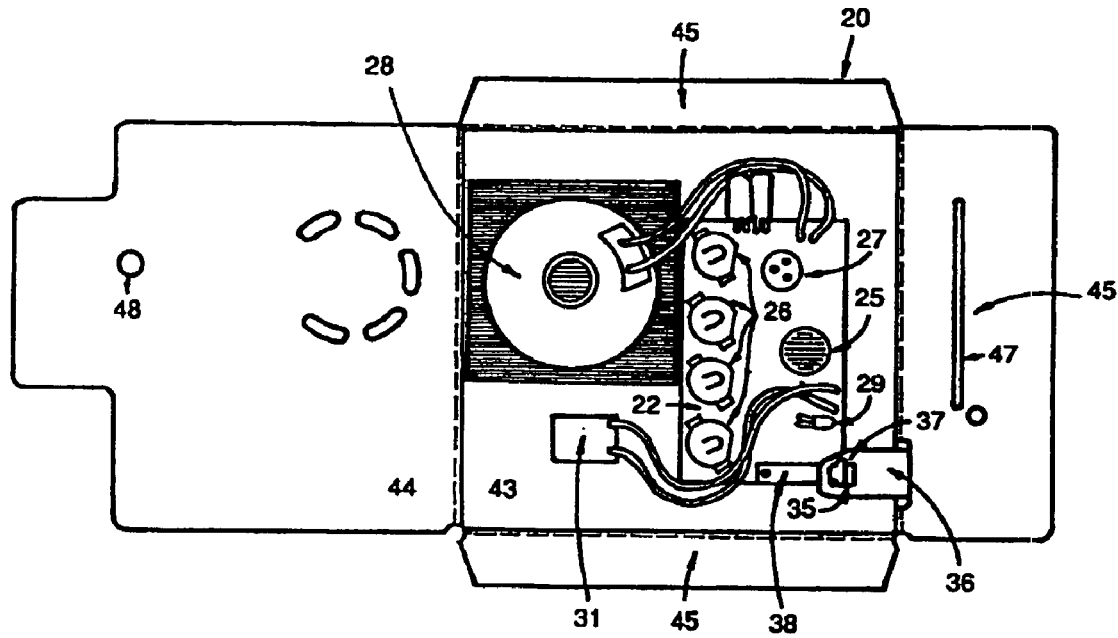

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 10 and 11 is confirmed.

Claims 1–4 and 9 are cancelled.

Claims 5–8 and 12 are determined to be patentable as amended.

New claims 13–18 are added and determined to be patentable.

5. [The] *A* multi-purpose, re-recordable, audible message delivery system [defined in claim 3,] *for enabling individuals to specialize or personalize a message for delivery to another, said system comprising:*
  A. *circuit means*
    *a. constructed for repeatedly recording and retaining an audio signal and delivering said recorded signal,*
    *b. responsive to a play activation signal for activating said circuit means to deliver a previously recorded audio signal,*
    *c. responsive to a record activation signal for enabling said circuit means to receive and record an audible message,*
    *d. comprising a speaker electronically connected to the circuit for delivering the audible message,*
    *e. a microphone mounted to the circuit means in interconnected, cooperating relationship with the message recording circuit thereof for receiving the audible message and delivering the audible message to the recording means, and*
    *f. an LED mounted to said circuit means and constructed for being activated in response to the activation of at least one switch means, thereby enabling the user to immediately know when said switch means has been moved from its normally off position to its on position;*
  B. *first switch means*
    *a. movable between an off position and an on position, and*
    *b. connected to said circuit means for transmitting thereto said play activation signal whenever said switch means is in its on position;*
  C. *second switch means*
    *a. movable between an off position and an on position, and*
    *b. connected to the circuit means for transmitting thereto said record activation signal whenever the second switch means is in its on position; and*
  D. *a housing constructed for*
    *a. supportingly retaining and protecting the circuit means,*
    *b. providing easy access to said first and second switch means,*
    *c. being movably positionable in a plurality of alternate positions and locations,*
    *d. peripherally surrounding and fully enveloping said circuit means, forming a completely self-contained message delivery system capable of being employed either independently or in association with a plurality of alternate products, and*
    *e. comprising fastening means formed on one surface thereof for enabling said audible message delivery system to be securely affixed to any desired surface, thereby effectively delivering the previously recorded message to another individual at any desired location,*
    *wherein said system is further defined as being removably mountable in receiving pockets formed in a plurality of alternate, cooperating products for enabling said products to possess re-recordable message delivering capabilities.*

6. The multi-purpose, re-recordable, audible message delivery system defined in claim 5, wherein said alternate products comprise at least one selected from the group consisting *of* picture frames, photo-display envelopes, medication-bearing packages, document holding folders, menus, table stands, mailing packages, books, diaries, journals, and business card holders.

7. [The] *A* multi-purpose, re-recordable, audible message delivery system [defined in claim 1, wherein said housing is further defined as comprising a] *for enabling individuals to specialize or personalize a message for delivery to another, said system comprising*
  A. *circuit means*
    *a. constructed for repeatedly recording and retaining an audio signal and delivering said recorded signal,*
    *b. responsive to a play activation signal for activating said circuit means to deliver a previously recorded audio signal,*
    *c. responsive to a record activation signal for enabling said circuit means to receive and record an audible message,*
    *d. comprising a speaker electronically connected to the circuit for delivering the audible message,*
    *e. a microphone mounted to the circuit means in interconnected, cooperating relationship with the message recording circuit thereof for receiving the audible message and delivering the audible message to the recording means, and*
    *f. an LED mounted to said circuit means and constructed for being activated in response to the activation of at least one switch means, thereby enabling the user to immediately know when said switch means has been moved from its normally off position to its on position;*
  B. *first switch means*
    *a. movable between an off position and an on position, and*
    *b. connected to said circuit means for transmitting thereto said play activation signal whenever said switch means is in its on position;*
  C. *second switch means*
    *a. movable between an off position and an on position, and*
    *b. connected to the circuit means for transmitting thereto said record activation signal whenever the second switch means is in its on position; and*

D. a housing constructed for
   a. supportingly retaining and protecting the circuit means,
   b. providing easy access to said first and second switch means, and
   c. being movably positionable in a plurality of alternate positions and locations,
   d. comprising a pivotable, longitudinally extending flange portion cooperatingly associated with the first switch means for automatically transmitting the play activation signal whenever the panel portion is moved from a first housing overlying position to a second outwardly pivoted position,
whereby a multi-purpose, re-recordable audible message delivery system is attained which is capable of being easily employed by any individual for recording any desired audible message as well as delivering the audible message upon demand whenever desired.

8. The multi-purpose, re-recordable, audible message delivery system defined in claim [1] 7, wherein said first and second switch means are further defined as comprising push-button type switch means constructed for being maintained in the off position and activated into the on position by compressing a portion thereof to bring the contacts formed therein into engagement with each other.

12. The multi-purpose, re-recordable, audible message delivery system defined in claim 11, wherein said stand is further defined as comprising [apertures] *apertured* zones formed therein and positioned for cooperating, overlying aligned interengagement with the switch means for enabling easy activation and use of said first and second switch means.

13. *A multi-purpose, re-recordable audible message delivery system for enabling individuals to specialize or personalize a message for delivery to another, said system comprising*
   A. *circuit means*
      a. *constructed for repeatedly recording and retaining an audio signal and delivering said recorded signal,*
      b. *responsive to a play activation signal for activating said circuit means to deliver a previously recorded audio signal,*
      c. *responsive to a record activation signal for enabling said circuit means to receive and record an audible message,*
      d. *comprising a speaker electronically connected to the circuit for delivering the audible message,*
      e. *a microphone mounted to the circuit means in interconnected, cooperating relationship with the message recording circuit thereof for receiving the audible message and delivering the audible message to the recording means, and*
      f. *an LED mounted to said circuit means and constructed for being activated in response to the activation of at least one switch means, thereby enabling the user to immediately know when said switch means has been moved from its normally off position to its on position;*
   B. *first switch means*
      a. *movable between an off position and an on position, and*
      b. *connected to said circuit means for transmitting thereto said play activation signal whenever said switch means is in its on position;*
   C. *second switch means*
      a. *movable between an off position and an on position, and*
      b. *connected to the circuit means for transmitting thereto said record activation signal whenever the second switch means is in its on position; and*
   D. *a housing constructed for*
      a. *supportingly retaining and protecting the circuit means,*
      b. *providing access to said first and second switch means,*
      c. *being movably positionable in a plurality of alternate positions and locations,*
      d. *peripherally surrounding and fully enveloping said circuit means, forming a completely self-contained message delivery system capable of being employed either independently or in association with a plurality of alternate product,*
      e. *being movably mountable or positionable in receiving pockets or retaining zones formed in a plurality of alternate, cooperating products for enabling said products to possess re-recordable message delivering capabilities, and*
      f. *maintaining said first switch means in position for activation while retained in said receiving pocket/retaining zone, said first switch means being cooperatively associated with a first designated switch activation are formed with said pocket/retaining zone,*
*whereby a multi-purpose, re-recordable audible message delivery system is attained which is capable of being easily employed by any individual for recording any desired audible message as well as delivering the audible message upon demand whenever desired.*

14. *The multi-purpose, re-recordable, audible message delivery system defined in claim 13, wherein said alternate products comprise at least one selected from the group consisting of picture frames, photo-display envelopes, medication-bearing packages, document holding folders, menus, table stands, mailing packages, books, diaries, journals, and business card holders.*

15. *The multi-purpose, re-recordable, audible message delivery system defined in claim 13, wherein the housing is further defined as being constructed for maintaining at least one additional element selected from the group consisting of the speaker, the microphone, the LED, the second switch means in position for use while retained in said receiving pocket/retaining zone with said additional element being associated with a cooperating area formed with said pocket/retaining zone.*

16. *A multi-purpose, re-recordable, audible message delivery system for enabling individuals to specialize or personalize a message for delivery to another, said system comprising*
   A. *circuit means*
      a. *constructed for repeatedly recording and retaining an audio signal and delivering said recorded signal,*
      b. *responsive to a play activation signal for activating said circuit means to deliver a previously recorded audio signal, and*
      c. *responsive to a record activation signal for enabling said circuit means to receive and record an audible message,*
      d. *comprising a speaker electronically connected to the circuit for delivering the audible message,*
      e. *a microphone mounted to the circuit means in interconnected, cooperating relationship with the message recording circuit thereof for receiving the audible message and delivering the audible message to the recording means, and* f. an LED mounted to said circuit means and constructed for being activated in response to the activation of at least one switch means, thereby enabling the user to immediately know when said switch means has been moved from its normally off position to its on position;

B. first switch means
   a. movable between an off position and an on position, and
   b. connected to said circuit means for transmitting thereto said play activation signal whenever said switch means is in its on position;

C. second switch means
   a. movable between an off position and an on position, and
   b. connected to the circuit means for transmitting thereto said record activation signal whenever the second switch means is in its on position; and D. a housing constructed for
   a. supportingly retaining and protecting the circuit means,
   b. providing access to said first and second switch means,
   c. being movably positionable in a plurality of alternate positions and locations; and E. a product comprising a photograph display construction incorporating
   a. a first retaining zone for enabling any desired picture to be retained therein, and
   b. a second retaining zone for receiving and retaining the housing of said audible message delivery system for enabling the housing and any personal message associated therewith to be inserted therein.

17. A multi-purpose, re-recordable audible message delivery system for enabling individuals to specialize or personalize a message for delivery to another, said system comprising
   A. circuit means
      a. constructed for repeatedly recording and retaining an audio signal and delivering said recorded signal,
      b. responsive to a play activation signal for activating said circuit means to deliver a previously recorded audio signal, and
      c. responsive to a record activation signal for enabling said circuit means to receive and record an audible message,
      d. comprising a speaker electronically connected to the circuit for delivering the audible message,
      e. a microphone mounted to the circuit means in interconnected, cooperating relationship with the message recording circuit thereof for receiving the audible message and delivering the audible message to the recording means, and
      f. an LED mounted to said circuit means and constructed for being activated in response to the activation of at least one switch means, thereby enabling the user to immediately know when said switch means has been moved from its normally off position to its on position;

B. first switch means
      a. movable between an off position and an on position, and
      b. connected to said circuit means for transmitting thereto said play activation signal whenever said switch means is in its on position;

C. second switch means
      a. movable between an off position and an on position, and
      b. connected to the circuit means for transmitting thereto said record activation signal whenever the second switch means is in its on position; and D. a housing constructed for
      a. supportingly retaining and protecting the circuit means,
      b. providing access to said first and second switch means,
      c. being movably positionable in a plurality of alternate positions and locations; and E. a product comprising a photograph display construction incorporating
      a. at least one picture retaining zone for enabling any desired picture to be inserted therein for display,
      b. a second retaining zone for receiving and retaining the housing of said message delivery system for enabling the housing to be inserted therein, and
      c. an aperture formed therein and positioned for cooperative alignment with the LED for enabling the LED to be visible whenever.

18. The multi-purpose, re-recordable, audible message delivery system defined in claim 17, wherein said photograph display construction is further defined as comprising apertured zones formed therein and positioned for cooperating, overlying aligned interengagement with the switch means for enabling easy activation and use of said first and second switch means.

* * * * *